(12) United States Patent
Li et al.

(10) Patent No.: US 12,366,597 B2
(45) Date of Patent: Jul. 22, 2025

(54) GROUNDING IMPEDANCE MEASURING CIRCUIT AND GROUNDING IMPEDANCE MEASURING METHOD

(71) Applicant: HUNAN SMALL QUICK SMART ELECTRONIC TECHNOLOGY CO., LTD., Shaoyang (CN)

(72) Inventors: Xiu Lian Li, Shaoyang (CN); Shi Jun Jiang, Shaoyang (CN)

(73) Assignee: HUNAN SMALL QUICK SMART ELECTRONIC TECHNOLOGY CO., LTD., Shaoyang (CN)

( * ) Notice: Subject to any disclaimer, the term of this patent is extended or adjusted under 35 U.S.C. 154(b) by 0 days.

(21) Appl. No.: 18/550,939

(22) PCT Filed: Sep. 27, 2022

(86) PCT No.: PCT/CN2022/121690
§ 371 (c)(1),
(2) Date: Sep. 15, 2023

(87) PCT Pub. No.: WO2023/061208
PCT Pub. Date: Apr. 20, 2023

(65) Prior Publication Data
US 2024/0044959 A1 Feb. 8, 2024

(30) Foreign Application Priority Data
Oct. 11, 2021 (CN) .......................... 202111180631.2

(51) Int. Cl.
G01R 27/18 (2006.01)
(52) U.S. Cl.
CPC .................................. G01R 27/18 (2013.01)

(58) Field of Classification Search
None
See application file for complete search history.

(56) References Cited

U.S. PATENT DOCUMENTS

2020/0227865 A1* 7/2020 Rossman ........... H01R 13/6594

FOREIGN PATENT DOCUMENTS

CN 207336643 U 5/2018
CN 109061366 A 12/2018
(Continued)

OTHER PUBLICATIONS

International Search Report and Written Opinion dated Dec. 15, 2022, for corresponding PCT Application No. PCT/CN2022/121690.

(Continued)

Primary Examiner — Farhana A Hoque
(74) Attorney, Agent, or Firm — Kinney & Lange, P.A.

(57) ABSTRACT

Provided are a grounding impedance measurement circuit and a grounding impedance measurement method. The grounding impedance measurement circuit detects a power supply voltage of an isolated alternating current power supply by means of disposing a power supply voltage detection circuit between a live wire and a neutral wire at the isolated alternating current power supply. Furthermore, by forming an alternating current positive half-cycle detection branch and an alternating current negative half-cycle detection branch between the live wire and the neutral wire at the isolated alternating current power supply as well as between a live wire and a neutral wire at a power wire of an electrical device, the grounding impedance value of the live wire and the grounding impedance value of the neutral wire can be accurately detected, such that an output line having an abnormal grounding impedance can be quickly identified.

14 Claims, 4 Drawing Sheets

(56) References Cited

FOREIGN PATENT DOCUMENTS

| | | | |
|---|---|---|---|
| CN | 109073696 | A | 12/2018 |
| CN | 113820544 | A | 12/2021 |
| CN | 216209478 | U | 4/2022 |
| RU | 2488129 | C1 | 7/2013 |

OTHER PUBLICATIONS

Office Action from Chinese Application No. 202111180631.2, dated May 18, 2024, 8 pages.

* cited by examiner

GROUNDING IMPEDANCE MEASURING CIRCUIT AND GROUNDING IMPEDANCE MEASURING METHOD

CROSS REFERENCE TO RELATED APPLICATION(S)

This patent application is a national stage of International Application No. PCT/CN2022/121690, filed on Sep. 27, 2022, which claims the benefit of and priority to Chinese Patent Application No. 202111180631.2 filed in China National Intellectual Property Administration on Oct. 11, 2021 and entitled "GROUND IMPEDANCE MEASUREMENT CIRCUIT AND GROUND IMPEDANCE MEASUREMENT METHOD". Both of the aforementioned applications are incorporated by reference herein in their entireties as part of the present application.

TECHNICAL FIELD

The present disclosure relates to the technical field of grounding impedance measurement for power lines of isolated power supplies, particularly relates to a grounding impedance measuring circuit, and further particularly relates to a grounding impedance measuring method using the grounding impedance measuring circuit.

BACKGROUND

Due to its specific power characteristics, an isolated power supply has been used in a wide range of occasions. However, it will become less secure and even cause security risks when an output line of the isolated power supply has earthing anomaly. For example, when a live wire from an isolated single-phase alternating current power supply output has small grounding impedance, an electric shock accident may occur when human body touches a neutral line from the power supply output. Similarly, when any power line from an isolated three-phase alternating current power supply output has small grounding impedance, an electric shock accident may also occur when human body touches other output power lines. None of the existing conventional detection methods can identify which output power line is the line with abnormal grounding impedance, or conduct real-time detection. Moreover, when there are multiple power lines with small grounding impedance, the detection result is inaccurate, and there is even a risk of electric shock without alarm. In addition, the existing conventional detection methods can only achieve qualitative detection. That is, they can only detect abnormal grounding impedance of an output line of a power supply, instead of detecting an accurate impedance value.

SUMMARY

The present disclosure provides a grounding impedance measuring circuit and a grounding impedance measuring method, so as to overcome the above defects of the existing conventional testing methods.

According to an aspect of the disclosure, a grounding impedance measuring circuit is provided, configured to detect whether grounding impedance of an output line of an isolated alternating current power supply is abnormal, including:

a power supply voltage detection circuit, arranged at the isolated alternating current power supply and connected between a live wire and a neutral line, and configured to detect a power supply voltage of the isolated alternating current power supply; and a grounding impedance detection circuit, arranged at the isolated alternating current power supply and at an electrical device power line and connected between the live wire and the neutral line, wherein a positive alternating current half-cycle detection branch and a negative alternating current half-cycle detection branch are provided between the live wire and the neutral line and configured to detect grounding impedance values of the live wire and the neutral line of the isolated alternating current power supply.

Further, the power supply voltage detection circuit includes a resistor R1, a resistor R2, and a first current detection device, the resistor R1 and the resistor R2 are connected in series between the live wire and the neutral line at the isolated alternating current power supply, the first current detection device is configured to detect current value flowing through the resistor R1 and the resistor R2, with resistance values of the resistor R1 and the resistor R2 known.

Further, the power supply voltage detection circuit further comprises a diode D1, a diode D2, a resistor R3, and a resistor R4; the resistor R3 and the resistor R4 are connected in series between the live wire and the neutral line at the isolated alternating current power supply and form a branch in parallel with a branch where the resistor R1 and the resistor R2 are located; the diode D1 is arranged on the branch where the resistor R1 and the resistor R2 are located, and a cathode of the diode D1 is connected to the live wire and an anode of the diode D1 is connected to the resistor R1; the diode D2 is arranged on a branch where the resistor R3 and the resistor R4 are located, and a cathode of the diode D2 is connected to the neutral line and an anode of the diode D2 is connected to the resistor R3, wherein voltage drops of the diode D1 and the diode D2 and resistance values of the resistor R3 and the resistor R4 are all known; and the first current detection device is configured to detect a current value of the branch where the resistor R1 and the resistor R2 are located in a negative alternating current half-cycle and detect a current value of the branch where the resistor R3 and the resistor R4 are located in a positive alternating current half-cycle.

Further, the grounding impedance detection circuit includes a diode $D_N$, a resistor $R_{N1}$, a resistor $R_{N2}$, a resistor $R_{L1}$, a resistor $R_{L2}$, a diode $D_L$, and a second current detection device; the diode $D_N$, the resistor $R_{N1}$ and the resistor $R_{N2}$ are connected in series between the live wire and a ground line; a cathode of the diode $D_N$ is connected to the live wire and an anode of the diode $D_N$ is connected to the resistor $R_{N1}$; the diode $D_L$, the resistor $R_{L1}$ and the resistor $R_{L2}$ are connected in series between the neutral line and the ground line; a cathode of the diode $D_L$ is connected to the neutral line and an anode of the diode $D_L$ is connected to the resistor $R_{L1}$; the live wire and the neutral line at the electrical device power line are separately connected to the ground line; impedance between the live wire and the ground line forms an equivalent resistance $R_L$; impedance between the neutral line and the ground line forms an equivalent resistance $R_N$; the equivalent resistance $R_L$, the diode $D_L$, the resistor $R_{L1}$, the resistor $R_{L2}$ and the equivalent resistance $R_N$ constitute the positive alternating current half-cycle detection branch; and the equivalent resistance $R_L$, the equivalent resistance $R_N$, the diode $D_N$, the resistor $R_{N1}$ and the resistor $R_{N2}$ constitute the negative alternating current half-cycle detection branch, wherein voltage drops of the diode $D_N$ and the diode $D_L$ are known, resistance values of the resistor $R_{N1}$, the resistor $R_{N2}$, the resistor $R_{L1}$ and the resistor $R_{L2}$ are all known, and the second current detection device is configured to measure a current value of a branch where the diode $D_L$, the resistor $R_{L1}$ and the resistor $R_{L2}$ are located in the positive alternating current half-cycle and detect a current value of a branch where the diode $D_N$, the resistor $R_{N1}$ and the resistor $R_{N2}$ are located in the negative alternating current half-cycle.

Further, the isolated alternating current power supply is an isolated single-phase alternating current power supply or an isolated three-phase alternating current power supply.

Moreover, the disclosure further provides a grounding impedance measuring method, using the grounding impedance measuring circuit as described above, including:

detecting a power supply voltage value of an isolated alternating current power supply;

detecting a current value in a positive alternating current half-cycle detection branch and a current value in a negative alternating current half-cycle detection branch separately; and computing grounding impedance values of a live wire and a neutral line on the basis of the detected power supply voltage value, the current value in the positive alternating current half-cycle detection branch and the current value in the negative alternating current half-cycle detection branch.

Further, the method includes:

comparing the grounding impedance values of the live wire and the neutral line with a preset security threshold, and if the grounding impedance value of the live wire or the grounding impedance value of the neutral line is smaller than the preset security threshold, sending an alarm.

Further, the step of detecting a power supply voltage value of an isolated alternating current power supply includes:

detecting a peak voltage U N across a resistor R1 by a voltmeter in a negative alternating current half-cycle, and with resistance values of the resistor R1 and a resistor R2 and a voltage drop of a diode D1 known, computing a voltage value between the neutral line and the live wire on the basis of formula $U_{NL}=U_N*(R1+R2)\div R1+U_D$, wherein $U_{NL}$ is a peak voltage of the neutral line relative to the live wire, and $U_D$ is the voltage drop of the diode D1; and detecting a peak voltage $U_L$ across a resistor R3 by the voltmeter in a positive alternating current half-cycle, and with resistance values of the resistor R3 and a resistor R4 and a voltage drop of a diode D2 known, computing a voltage value between the neutral line and the live wire on the basis of formula $U_{LN}=U_L*(R3+R4)\div R3+U_D$, wherein $U_{LN}$ is a peak voltage of the live wire relative to the neutral line, and $U_D$ is the voltage drop of the diode D2.

Further, the process of detecting a current value in a positive alternating current half-cycle detection branch and a current value in a negative alternating current half-cycle detection branch separately specifically includes:

measuring a peak voltage $U_{N1}$ across a resistor $R_{N1}$ by a voltmeter in the negative alternating current half-cycle, and with resistance values of the resistor $R_{N1}$ and a resistor $R_{N2}$ and a voltage drop of a diode $D_N$ known, computing a current value of a branch where the resistor $R_{N1}$ is located on the basis of formula $I_{N1}=U_{N1}/R_{N1}$, and computing a voltage value between a ground line and the live wire on the basis of formula $U_{EL}=U_{N1}*(R_{N1}+R_{N2})\div R_{N1}+U_D$, wherein $U_{EL}$ is a peak voltage of the ground line relative to the live wire, and $U_D$ is the voltage drop of the diode $D_N$; and measuring a peak voltage $U_{L1}$ across a resistor $R_{L1}$ by the voltmeter in the positive alternating current half-cycle, and with resistance values of the resistor $R_{L1}$ and a resistor $R_{L2}$ and a voltage drop of a diode $D_L$ known, computing a current value of a branch where the resistor $R_{L1}$ is located on the basis of formula $I_{L1}=U_{L1}/R_{L1}$, and computing a voltage value between the ground line and the neutral line on the basis of formula $U_{EN}=U_{L1}*(R_{L1}+R_{L2})\div R_{L1}+U_D$, wherein $U_{EN}$ is a peak voltage of the ground line relative to the neutral line, and $U_D$ is the voltage drop of the diode $D_L$.

Further, the process of computing grounding impedance values of a live wire and a neutral line on the basis of the detected power supply voltage value, the current value in the positive alternating current half-cycle detection branch and the current value in the negative alternating current half-cycle detection branch specifically comprises:

in the negative alternating current half-cycle, $I_N=I_{N0}+I_{N1}$, wherein $I_N$ is a total current in a measuring loop, $I_N=(U_{NL}-U_{EL})/R_N$, $I_{N0}$ is a current value between the live wire and the ground line, and $I_{N0}=U_{EL}/R_L$;

in the positive alternating current half-cycle, $I_L=I_{L0}+I_{L1}$ wherein $I_L$ is a total current in a measuring loop, $I_L=(U_{LN}-U_{EL})/R_L$, $I_{L0}$ is a current value between the neutral line and the ground line, and $I_{L0}=U_{EN}/R_N$; and substituting $U_{NL}$, $U_{LN}$, $U_{EN}$, $U_{EL}$, $I_N$ and $I_{N0}$ into formulas for a combined solution to obtain:

$$R_L=[(U_{NL}-U_{EL}*(U_{LN}-U_{EN})-(U_{EN}*U_{EL})]\div[I_{N1}*U_{EN}+I_{L1}(U_{NL}-U_{EL})]$$

$$R_N=[(U_{NL}-U_{EL}*(U_{LN}-U_{EN})-(U_{EN}*U_{EL})]\div[I_{L1}*U_{EN}+I_{N1}(U_{LN}-U_{EN})]$$

The present disclosure has the following effects:

According to the grounding impedance measuring circuit of the present disclosure, by arranging the power supply voltage detection circuit between the live wire and the neutral line at the isolated alternating current power supply to detect the power supply voltage of the isolated alternating current power supply, and providing the positive alternating current half-cycle detection branch and the negative alternating current half-cycle detection branch between the live wire and the neutral line at the isolated alternating current power supply and between the live wire and the neutral line at the electrical device power line, the grounding impedance value of the live wire and the grounding impedance value of the neutral line can be accurately detected, such that on which output line occurs abnormal grounding impedance can be quickly identified. Moreover, quantitative testing is achieved, which has a positive effect on electrical security guarantee and line detection and maintenance.

In addition, the grounding impedance measuring method of the present disclosure also has the advantages described above.

The present disclosure has other objectives, features and advantages other than the objectives, features and advantages as described above. The present disclosure will be further described in detail below with reference to drawings.

BRIEF DESCRIPTION OF THE DRAWINGS

The drawings serve as a constituent part of the present application to provide further understanding of the present disclosure, and illustrative embodiments of the present disclosure and the description thereof are used to explain the present disclosure, which are not intended to unduly limit the present disclosure. In the accompanying drawings.

DETAILED DESCRIPTION OF THE EMBODIMENTS

Embodiments of the present disclosure will be described in detail below with reference to the accompanying drawings, but the present disclosure can be implemented in a plurality of different modes as limited and involved below.

Figure 1:
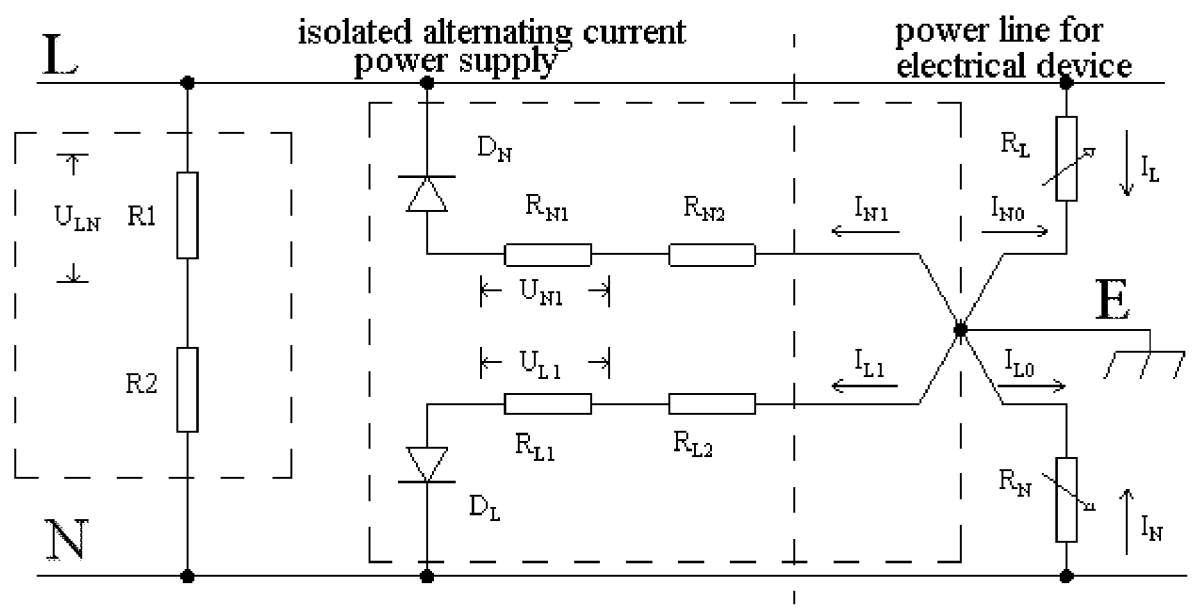
FIG. 1 is a schematic principle diagram of a grounding impedance measuring circuit according to a preferred embodiment of the present disclosure.

As shown in FIG. 1, a preferred embodiment of the present disclosure provides a grounding impedance measuring circuit, configured to detect whether grounding impedance of an output line of an isolated alternating current power supply is abnormal and including:

a power supply voltage detection circuit arranged on an isolated alternating current power supply side, and connected between a live wire and a neutral line, and configured to detect a power supply voltage of the isolated alternating current power supply; and a grounding impedance detection circuit arranged on the isolated alternating current power supply side and an electrical device power line side, and connected between the live wire and the neutral line, where a positive alternating current half-cycle detection branch and a negative alternating current half-cycle detection branch are provided between the live wire and the neutral line and configured to detect grounding impedance values of the live wire and the neutral line of the isolated alternating current power supply.

It may be understood that according to the grounding impedance measuring circuit of the embodiment, by arranging the power supply voltage detection circuit between the live wire and the neutral line on the isolated alternating current power supply side to detect the power supply voltage of the isolated alternating current power supply, and providing the positive alternating current half-cycle detection branch and the negative alternating current half-cycle detection branch between the live wire and the neutral line on the isolated alternating current power supply side and between the live wire and the neutral line on the electrical device power line side, the grounding impedance value of the live wire and the grounding impedance value of the neutral line can be accurately measured, such that on which output line occurs abnormal grounding impedance can be quickly identified. Moreover, quantitative testing is achieved, which has a positive effect on electrical security guarantee and line detection and maintenance.

Specifically, the power supply voltage detection circuit includes a resistor R1, a resistor R2, and a first current detection device. The resistor R1 and the resistor R2 are connected in series between the live wire and the neutral line on the isolated alternating current power supply side. The first current detection device is configured to detect values of currents flowing through the resistor R1 and the resistor R2. Resistance values of the resistor R1 and the resistor R2 are known. An ammeter may be used as the first current detection device. The ammeter may be directly connected in series into a branch where the resistor R1 and the resistor R2 are located. The resistance values of the resistor R1 and the resistor R2 are known, such that a voltage value between the live wire and the neutral line on the isolated alternating current power supply side may be computed in combination with the detected current value in the branch. Alternatively, a voltmeter may be used as the first current detection device. The voltmeter may be connected in parallel with the resistor R1 or the resistor R2, such that the value of the current flowing through the resistor R2 may be measured, and then a value of the voltage between the live wire and the neutral line on the isolated alternating current power supply side may be computed.

Figure 2:
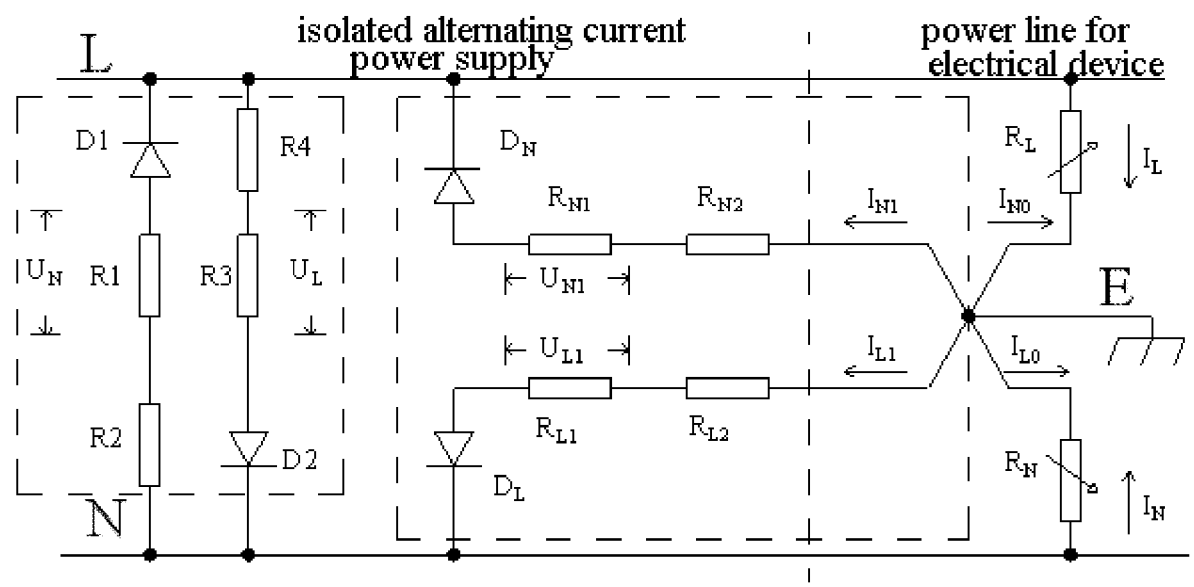
FIG. 2 is a schematic principle diagram of a grounding impedance measuring circuit according to another embodiment of the present disclosure.

Preferably, as shown in FIG. 2, in another embodiment of the present disclosure, the power supply voltage detection circuit further includes a diode D1, a diode D2, a resistor R3, and a resistor R4. The resistor R3 and the resistor R4 are connected in series between a live wire and a neutral line on an isolated alternating current power supply side and form a branch in parallel with the branch where the resistor R1 and the resistor R2 are located. The diode D1 is arranged on the branch where the resistor R1 and the resistor R2 are located. The diode D1 has a cathode connected to the live wire and an anode connected to the resistor R1. The diode D2 is arranged on a branch where the resistor R3 and the resistor R4 are located. The diode D2 has a cathode connected to the neutral line and an anode connected to the resistor R3. Voltage drops of the diode D1 and the diode D2 and resistance values of the resistor R3 and the resistor R4 are all known. The first current detection device is configured to measure a current value of the branch where the resistor R1 and the resistor R2 are located in a negative alternating current half-cycle and a current value of the branch where the resistor R3 and the resistor R4 are located in a positive alternating current half-cycle. In the negative alternating current half-cycle, the neutral line has a higher potential than the live wire, the branch where the resistor R1, the resistor R2 and the diode D1 are located is conductive, and the branch where the resistor R3, the resistor R4 and the diode D2 are located is not conductive. By measuring a current value of the branch where the resistor R1, the resistor R2 and the diode D1 are located, a power supply voltage of the negative alternating current half-cycle may be computed. In the positive alternating current half-cycle, the live wire has a higher potential than the neutral line, the branch where the resistor R1, the resistor R2 and the diode D1 are located is not conductive, and a branch where the resistor R3, the resistor R4 and the diode D2 are located is conductive. By measuring a current value of the branch where the resistor R3, the resistor R4 and the diode D2 are located, power supply voltage of the positive alternating current half-cycle may be computed. The number of the first current detection devices is two, and the two parallel branches are each provided with one of the first current detection devices.

For example, in the negative alternating current half-cycle, a peak voltage across the resistor R1 is measured to be $U_N$, and a peak voltage $U_{NL}$ between the neutral line and the live wire in this case may be computed with a computation formula as follows:

$$U_{NL} = U_N * (R1+R2) \div R1 + U_D \qquad \text{Formula 1}$$

where, $U_{NL}$, is a peak voltage of the neutral line relative to the live wire, $U_D$ is a voltage drop of the diode D1, R1 is a resistance value of the resistor R1, and R2 is a resistance value of the resistor R2. R1, R2 and $U_D$ are all known, such that $U_{NL}$, may be computed by measuring $U_N$.

Similarly, in the positive alternating current half-cycle, a peak voltage across the resistor R3 is measured to be $U_L$, and a peak voltage $U_{LN}$ between the neutral line and the live wire in this case may be computed with a computation formula as follows:

$$U_{LN}=U_L*(R3+R4)\div R3+U_D \qquad \text{Formula 2}$$

where, $U_{NL}$ is a peak voltage of the live wire relative to the neutral line, and $U_D$ is a voltage drop of the diode D2. R3, R4 and $U_D$ are all known, such that $U_{LN}$ may be computed by measuring $U_L$.

It may be understood that by arranging two parallel detection branches, and arranging one diode in each detection branch for forward conduction and reverse cutoff, interference between the positive alternating current half-cycle and the negative alternating current half-cycle may be effectively reduced, ensuring a more accurate detection result for the power supply voltage.

Figure 3:
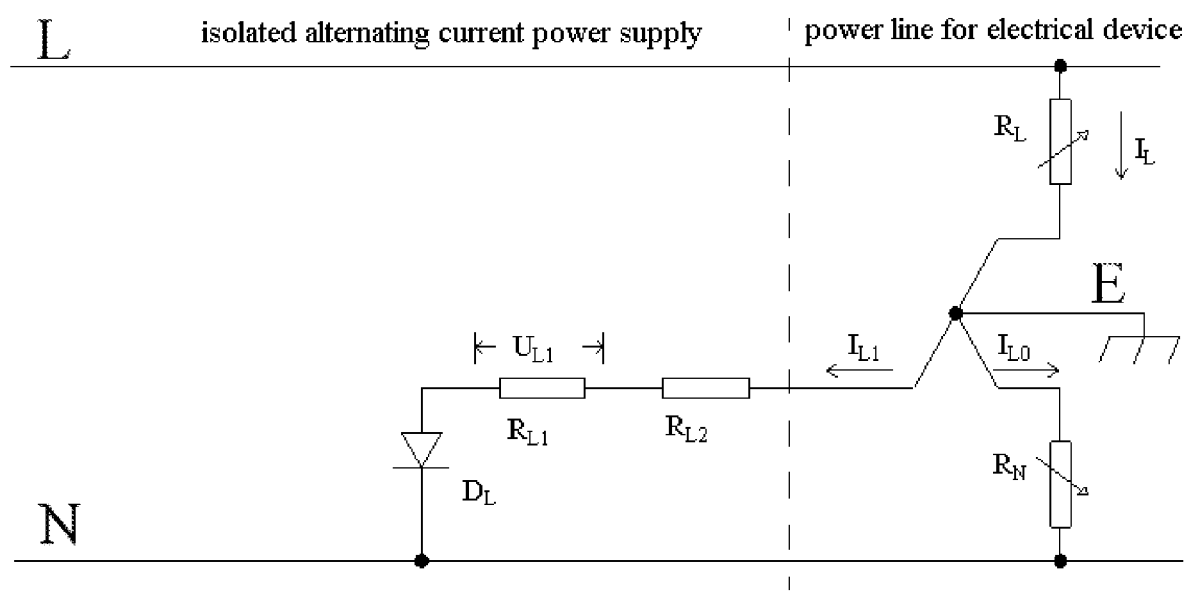
FIG. 3 is a schematic principle diagram of a positive alternating current half-cycle detection branch according to a preferred embodiment of the present disclosure.
Figure 4:
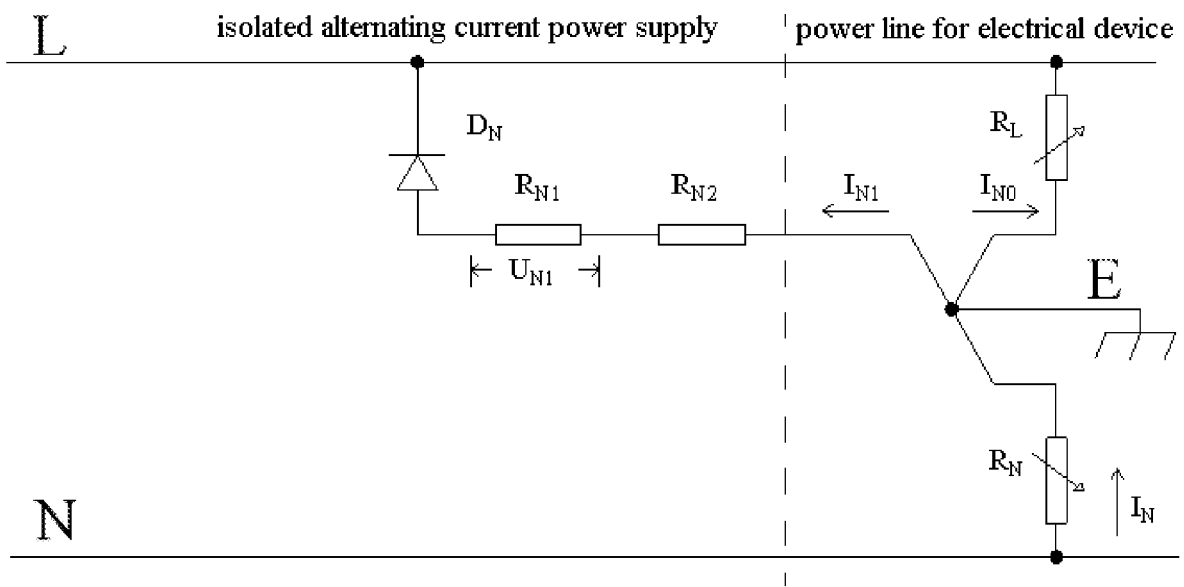
FIG. 4 is a schematic principle diagram of a negative alternating current half-cycle detection branch according to a preferred embodiment of the present disclosure.

It may be understood that as shown in FIGS. 2, 3 and 4, the grounding impedance detection circuit includes a diode $D_N$, a resistor $R_{N1}$, a resistor $R_{N2}$, a resistor $R_{L1}$, a resistor $R_{L2}$, a diode $D_L$, and a second current detection device. The diode $D_N$, the resistor $R_{N1}$ and the resistor $R_{N2}$ are connected in series between the live wire and a ground line. The diode $D_N$ has a cathode connected to the live wire and an anode connected to the resistor $R_{N1}$. The diode $D_L$, the resistor $R_{L1}$ and the resistor $R_{L2}$ are connected in series between the neutral line and the ground line. The diode $D_L$ has a cathode connected to the neutral line and an anode connected to the resistor $R_{L1}$. The live wire and the neutral line on the electrical device power line side are separately connected to the ground line. Impedance between the live wire and the ground line forms an equivalent resistance $R_L$. Impedance between the neutral line and the ground line forms an equivalent resistance $R_N$. The equivalent resistance $R_L$, the diode $D_L$, the resistor $R_{L1}$, the resistor $R_{L2}$ and the equivalent resistance $R_N$ constitute the positive alternating current half-cycle detection branch, specifically as shown in FIG. 3. The equivalent resistance $R_L$, the equivalent resistance $R_N$, the diode $D_N$, the resistor $R_{N1}$ and the resistor $R_{N2}$ constitute the negative alternating current half-cycle detection branch, specifically as shown in FIG. 4. Voltage drops of the diode $D_N$ and the diode $D_L$ are known. Resistance values of the resistor $R_{N1}$, the resistor $R_{N2}$, the resistor $R_{L1}$ and the resistor $R_{L2}$ are all known. The second current detection device is configured to detect a current value of a branch where the diode $D_L$, the resistor $R_{L1}$ and the resistor $R_{L2}$ are located in the positive alternating current half-cycle and a current value of a branch where the diode $D_N$, the resistor $R_{N1}$ and the resistor $R_{N2}$ are located in the negative alternating current half-cycle. It may be understood that the second current detection device is the same as the first current detection device, and a voltmeter is preferably used for both.

Specifically, a peak voltage $U_{N1}$ across the resistor $R_{N1}$ is detected by the voltmeter in the negative alternating current half-cycle. The resistance values of the resistor $R_{N1}$ and the resistor $R_{N2}$ and the voltage drop of the diode $D_N$ are all known, such that a peak voltage between the ground line E and the live wire L may be computed with a computation formula as follows:

$$U_{EL}=U_{N1}*(R_{N1}+R_{N2})\div R_{N1}+U_D \qquad \text{Formula 3}$$

$U_{EL}$ is a peak voltage of the ground line relative to the live wire, $U_D$ is a voltage drop of the diode $D_N$, $R_{N1}$ is a resistance value of the resistor $R_{N1}$, and $R_{N2}$ is a resistance value of the resistor $R_{N2}$.

Similarly, a peak voltage $U_{L1}$ across the resistor $R_{L1}$ is detected by the voltmeter in the positive alternating current half-cycle. The resistance values of the resistor $R_{L1}$ and the resistor $R_{L2}$ and the voltage drop of the diode $D_L$ are all known, such that a peak voltage between the ground line E and the neutral line N may be computed with a computation formula as follows:

$$U_{EN}=U_{L1}*(R_{L1}+R_{L2})\div R_{L1}+U_D \qquad \text{Formula 4}$$

$U_{EN}$ is a peak voltage of the ground line relative to the neutral line, $U_D$ is a voltage drop of the diode $D_L$, $R_{N3}$ is a resistance value of the resistor $R_{N3}$, and $R_{N4}$ is a resistance value of the resistor $R_{N4}$.

Meanwhile, the following may be obtained by computation:

$$I_{N1}=U_{N1}/R_{N1} \qquad \text{Formula 5}$$

$$I_{L1}=U_{L1}/R_{L1} \qquad \text{Formula 6}$$

$I_{N1}$ is a current value of a branch where the resistor $R_{N1}$ is located in the negative alternating current half-cycle, and $I_{L1}$ is a current value of a branch where the resistor $R_{L1}$ is located in the positive alternating current half-cycle.

In the negative alternating current half-cycle, if $U_{NL}=R_N*I_N+U_{EL}$, $$I_N=(U_{NL}-U_{EL})/R_N \qquad \text{Formula 7}$$

$I_N$ is a total current in a measuring loop in the negative alternating current half-cycle.

Similarly, in the positive alternating current half-cycle, if $U_{LN}=R_L*I_L+U_{EN}$, $$I_L=(U_{LN}-U_{EN})/R_L \qquad \text{Formula 8}$$

$I_L$ is a total current in a measuring loop in the positive alternating current half-cycle.

Meanwhile, $$I_{N0}=U_{EL}/R_L \qquad \text{Formula 9}$$

$$I_{L0}=U_{EN}/R_N \qquad \text{Formula 10}$$

$I_{N0}$ is a current value between the live wire and the ground line in a negative current half-cycle, and $I_{L0}$ is a current value between the neutral line and the ground line in a positive current half-cycle.

And, $$I_N=I_{N0} \qquad \text{Formula 11}$$

$$I_L=I_{L0}+I_{L1} \qquad \text{Formula 12}$$

Formula 7 and Formula 9 are substituted into Formula 11 to obtain:

$$(U_{NL}-U_{EL})/R_N=U_{EL}/R_L+I_{N1} \qquad \text{Formula 13}$$

Formula 8 and Formula 10 are substituted into Formula 12 to obtain:

$$(U_{LN}-U_{EN})/R_L=U_{EN}/R_N+I_{L1} \qquad \text{Formula 14}$$

Formula 13 and Formula 14 are solved to obtain:

$$R_L=[(U_{NL}-U_{EL}*(U_{LN}-U_{EN})-(U_{EN}*U_{EL})]\div[I_{N1}*U_{EN}+I_{L1}(U_{NL}-U_{EL})]$$

$$R_N=[(U_{NL}-U_{EL}*(U_{LN}-U_{EN})-(U_{EN}*U_{EL})]\div[I_{1L}*U_{EN}+I_{N1}(U_{LN}-U_{EL})]$$

In addition, the isolated alternating current power supply is an isolated single-phase alternating current power supply or an isolated three-phase alternating current power supply.

In addition, another embodiment of the present disclosure further provides a grounding impedance measuring method, which preferably adopts the grounding impedance measuring circuit described above and includes the following steps:

detecting a power supply voltage value of an isolated alternating current power supply;

detecting a current value in a positive alternating current half-cycle detection branch and a current value in a negative alternating current half-cycle detection branch separately; and computing grounding impedance values of a live wire and a neutral line on the basis of the detected power supply voltage value, the current value in the positive alternating current half-cycle detection branch and the current value in the negative alternating current half-cycle detection branch.

It may be understood that according to the grounding impedance measuring method of the embodiment, a power supply voltage of the isolated alternating current power supply is detected by a power supply voltage detection circuit, then the current value in the positive alternating current half-cycle detection branch and the current value in the negative alternating current half-cycle detection branch are separately measured, and finally the grounding impedance values of the live wire and the neutral line may be computed on the basis of the power supply voltage value, the current value in the positive alternating current half-cycle detection branch and the current value in the negative alternating current half-cycle detection branch. Accordingly, the grounding impedance value of the live wire and the grounding impedance value of the neutral line can be accurately detected, such that an output line having abnormal grounding impedance can be quickly identified. Moreover, quantitative detection is achieved, which has a positive effect on electrical security guarantee and line detection and maintenance.

It may be understood that in other embodiments of the present disclosure, the grounding impedance measuring method further includes the following step:

comparing the grounding impedance values of the live wire and the neutral line with a preset security threshold, and if the grounding impedance value of the live wire or the grounding impedance value of the neutral line is smaller than the preset security threshold, sending an alarm.

It may be understood that the process of detecting the power supply voltage value of the isolated alternating current power supply is measured includes the following steps:

detecting a peak voltage $U_N$ across the resistor R1 by a voltmeter in a negative alternating current half-cycle, with resistance values of the resistor R1 and the resistor R2 and the voltage drop of the diode D1 all known, computing the voltage value between the neutral line and the live wire on the basis of formula $U_{NL}=U_N*(R1+R2) \div R1+U_D$, where $U_{NL}$ is a peak voltage of the neutral line relative to the live wire, and $U_D$ is the voltage drop of the diode D1; and detecting a peak voltage U L across the resistor R3 by the voltmeter in a positive alternating current half-cycle, with resistance values of the resistor R3 and the resistor R4 and the voltage drop of the diode D2 all known, computing a voltage value between the neutral line and the live wire on the basis of formula $U_{LN}=U_L*(R3+R4) \div R3+U_D$, where $U_{LN}$ is a peak voltage of the live wire relative to the neutral line, and $U_D$ is the voltage drop of the diode D2.

It may be understood that the process of detecting the current value in the positive alternating current half-cycle detection branch and the current value in the negative alternating current half-cycle detection branch separately specifically includes the following steps:

detecting a peak voltage $U_{N1}$ across the resistor $R_{N1}$ by a voltmeter in a negative alternating current half-cycle, with resistance values of the resistor $R_{N1}$ and the resistor $R_{N2}$ and the voltage drop of the diode $D_N$ all known, computing a current value of a branch where the resistor $R_{N1}$ is located on the basis of formula $I_{N1}=U_{N1}/R_{N1}$, and computing a voltage value between the ground line and the live wire on the basis of formula $U_{EL}=U_{N1}*(R_{N1}+R_{N2}) \div R_{N1}+U_D$, where $U_{EL}$ is a peak voltage of the ground line relative to the live wire, and $U_D$ is the voltage drop of the diode $D_N$; and detecting a peak voltage $U_{L1}$ across the resistor $R_{L1}$ by the voltmeter in a positive alternating current half-cycle, with resistance values of the resistor $R_{L1}$ and the resistor $R_{L2}$ and the voltage drop of the diode $D_L$ all known, computing a current value of a branch where the resistor $R_{L1}$ is located on the basis of formula $I_{L1}=U_{L1}/R_{L1}$, and computing a voltage value between the ground line and the neutral line on the basis of formula $U_{EN}=U_{L1}*(R_{L1}+R_{L2}) \div R_{L1}+U_D$, where $U_{EN}$ is a peak voltage of the ground line relative to the neutral line, and $U_D$ is the voltage drop of the diode $D_L$.

It may be understood that the process of computing the grounding impedance values of the live wire and the neutral line on the basis of the detected power supply voltage value, the current value in the positive alternating current half-cycle detection branch and the current value in the negative alternating current half-cycle detection branch specifically includes the following:

in the negative alternating current half-cycle, $I_N=I_{N0}+I_{N1}$, where $I_N$ is a total current in the measuring loop, $I_N=(U_{NL}-U_{EL})/R_N$, $I_{N0}$ is a current value between the live wire and the ground line, and $I_{N0}=U_{EL}/R_L$;

in the positive alternating current half-cycle, $I_L=I_{L0}+I_{L1}$, where $I_L$ is a total current in the measuring loop, $I_L=(U_{LN}-U_{EL})/R_L$, $I_{L0}$ is a current value between the neutral line and the ground line, and $I_{L0}=U_{EN}/R_N$; and Substituting $U_{NL}$, $U_{LN}$, $U_{EN}$, $U_{EL}$, $I_N$ and $I_{N0}$ into the formula for a combined solution to obtain:

$$R_L=[(U_{NL}-U_{EL}*(U_{LN}-U_{EN})-(U_{EN}*U_{EL})] \div [I_{N1}*U_{EN}+I_{L1}(U_{NL}-U_{EL})]$$

$$R_N=[(U_{NL}-U_{EL}*(U_{LN}-U_{EN})-(U_{EN}*U_{EL})] \div [I_{L1}*U_{EN}+I_{N1}(U_{LN}-U_{EL})]$$

In addition, some errors are inevitable during measurement, such that some values close to a limit need to be predicted to avoid computation errors. For example, when it is measured that $U_{L1}$ is close to 0, it may be considered that $R_L$ is very large, that is, the live wire has a normal grounding impedance value. When it is measured that $U_{N1}$ is close to 0, it may be considered that $R_N$ is very large, that is, the neutral line has a normal grounding impedance value. In addition, when it is measured that $U_{EN}$ is close to $U_{LN}$, it may be considered that $R_L$ is very small, that is, the live wire has an abnormal grounding impedance value. When it is measured that $U_{EL}$ is close to $U_{NL}$, it may be considered that $R_N$ is very small, that is, the neutral line has an abnormal grounding impedance value. It may be understood that it is difficult to measure an accurate grounding impedance value in the case of the above limit value.

What are described above are merely preferred embodiments of the present disclosure and are not intended to limit the present disclosure, and those skilled in the art can make various modifications and changes to the present disclosure. Any modification, equivalent substitution, improvement, etc., within the spirit and principles of the present disclosure shall fall within the scope of protection of the present disclosure.

What is claimed is:

1. A grounding impedance measuring circuit, configured to detect whether grounding impedance of an output line of an isolated alternating current power supply is abnormal, comprising:
    a power supply voltage detection circuit, arranged at the isolated alternating current power supply and connected between a live wire and a neutral line, and configured to detect a power supply voltage of the isolated alternating current power supply; and
    a grounding impedance detection circuit, arranged at the isolated alternating current power supply and at an electrical device power line and connected between the live wire and the neutral line, wherein a positive alternating current half-cycle detection branch and a negative alternating current half-cycle detection branch are provided between the live wire and the neutral line and configured to detect grounding impedance values of the live wire and the neutral line of the isolated alternating current power supply.

2. The grounding impedance measuring circuit according to claim 1, wherein the power supply voltage detection circuit comprises a resistor R1, a resistor R2, and a first current detection device, the resistor R1 and the resistor R2 are connected in series between the live wire and the neutral line at the isolated alternating current power supply, the first current detection device is configured to detect current value flowing through the resistor R1 and the resistor R2, with resistance values of the resistor R1 and the resistor R2 being known.

3. The grounding impedance measuring circuit according to claim 2, wherein
    the power supply voltage detection circuit further comprises a diode D1, a diode D2, a resistor R3, and a resistor R4;
    the resistor R3 and the resistor R4 are connected in series between the live wire and the neutral line at the isolated alternating current power supply and form a branch in parallel with a branch where the resistor R1 and the resistor R2 are located;
    the diode D1 is arranged on the branch where the resistor R1 and the resistor R2 are located, and a cathode of the diode D1 is connected to the live wire and an anode of the diode D1 is connected to the resistor R1;
    the diode D2 is arranged on a branch where the resistor R3 and the resistor R4 are located, and a cathode of the diode D2 is connected to the neutral line and an anode of the diode D2 is connected to the resistor R3, wherein voltage drops of the diode D1 and the diode D2 and resistance values of the resistor R3 and the resistor R4 are all known; and
    the first current detection device is configured to detect a current value of the branch where the resistor R1 and the resistor R2 are located in a negative alternating current half-cycle and detect a current value of the branch where the resistor R3 and the resistor R4 are located in a positive alternating current half-cycle.

4. The grounding impedance measuring circuit according to claim 1, wherein
    the grounding impedance detection circuit comprises a diode $D_N$, a resistor $R_{N1}$, a resistor $R_{N2}$, a resistor $R_{L1}$, a resistor $R_{L2}$, a diode $D_L$, and a second current detection device;
    the diode $D_N$, the resistor $R_{N1}$ and the resistor $R_{N2}$ are connected in series between the live wire and a ground line;
    a cathode of the diode $D_N$ is connected to the live wire and an anode of the diode $D_N$ is connected to the resistor $R_{N1}$;
    the diode $D_L$, the resistor $R_{L1}$ and the resistor $R_{L2}$ are connected in series between the neutral line and the ground line; a cathode of the diode $D_L$ is connected to the neutral line and an anode of the diode $D_L$ is connected to the resistor $R_{L1}$;
    the live wire and the neutral line at the electrical device power line are separately connected to the ground line; impedance between the live wire and the ground line forms an equivalent resistance $R_L$;
    impedance between the neutral line and the ground line forms an equivalent resistance $R_N$;
    the equivalent resistance $R_L$, the diode $D_L$, the resistor $R_{L1}$, the resistor $R_{L2}$ and the equivalent resistance $R_N$ constitute the positive alternating current half-cycle detection branch; and
    the equivalent resistance $R_L$, the equivalent resistance $R_N$, the diode $D_N$, the resistor $R_{N1}$ and the resistor $R_{N2}$ constitute the negative alternating current half-cycle detection branch,
    wherein voltage drops of the diode $D_N$ and the diode $D_L$ are known, resistance values of the resistor $R_{N1}$, the resistor $R_{N2}$, the resistor $R_{L1}$ and the resistor $R_{L2}$ are all known, and the second current detection device is configured to measure a current value of a branch where the diode $D_L$, the resistor $R_{L1}$ and the resistor $R_{L2}$ are located in the positive alternating current half-cycle and detect a current value of a branch where the diode $D_N$, the resistor $R_{N1}$ and the resistor $R_{N2}$ are located in the negative alternating current half-cycle.

5. The grounding impedance measuring circuit according to claim 1, wherein the isolated alternating current power supply is an isolated single-phase alternating current power supply or an isolated three-phase alternating current power supply.

6. A grounding impedance measuring method, using the grounding impedance measuring circuit according to claim 1, and comprising:
    detecting the power supply voltage value of the isolated alternating current power supply;
    detecting a current value in the positive alternating current half-cycle detection branch and a current value in the negative alternating current half-cycle detection branch separately; and
    computing grounding impedance values of the live wire and the neutral line on the basis of the detected power supply voltage value, the current value in the positive alternating current half-cycle detection branch and the current value in the negative alternating current half-cycle detection branch.

7. The grounding impedance measuring method according to claim 6, further comprising:
    comparing the grounding impedance values of the live wire and the neutral line with a preset security threshold, and if the grounding impedance value of the live wire or the grounding impedance value of the neutral line is smaller than the preset security threshold, sending an alarm.

8. The grounding impedance measuring method according to claim 6, wherein the step of detecting the power supply voltage value of the isolated alternating current power supply comprises:
   detecting a peak voltage $U_N$ across a resistor R1 by a voltmeter in a negative alternating current half-cycle, and with resistance values of the resistor R1 and a resistor R2 and a voltage drop of a diode D1 being known, computing a voltage value between the neutral line and the live wire on the basis of the formula:

$U_{NL}=U_N*(R1+R2)\div R1+U_D,$ wherein $U_{NL}$ is a peak voltage of the neutral line relative to the live wire,
   and $U_D$ is the voltage drop of the diode D1; and
   detecting a peak voltage $U_L$ across a resistor R3 by the voltmeter in a positive alternating current half-cycle, and with resistance values of the resistor R3 and a resistor R4 and a voltage drop of a diode D2 being known, computing a voltage value between the neutral line and the live wire on the basis of the formula;

$U_{LN}=U_L*(R3+R4)\div R3+U_D,$ wherein $U_{LN}$ is a peak voltage of the live wire relative to the neutral line, and $U_D$ is the voltage drop of the diode D2.

9. The grounding impedance measuring method according to claim 8, wherein detecting a current value in the positive alternating current half-cycle detection branch and a current value in the negative alternating current half-cycle detection branch separately specifically comprises:
   measuring a peak voltage $U_{N1}$ across a resistor $R_{N1}$ by a voltmeter in the negative alternating current half-cycle, and with resistance values of the resistor $R_{N1}$ and a resistor $R_{N2}$ and a voltage drop of a diode $D_N$ being known, computing a current value $I_{N1}$ of a branch where the resistor $R_{N1}$ is located on the basis of the formula:

$I_{N1}=U_{N1}/R_{N1},$ and computing a voltage value between a ground line and the live wire on the basis of the formula:

$U_{EL}=U_{N1}*(R_{N1}+R_{N2})\div R_{N1}+U_D,$ wherein $U_{EL}$ is a peak voltage of the ground line relative to the live wire,
   and $U_D$ is the voltage drop of the diode $D_N$; and
   measuring a peak voltage $U_{L1}$ across a resistor $R_{L1}$ by the voltmeter in the positive alternating current half-cycle, and with resistance values of the resistor $R_{L1}$ and a resistor $R_{L2}$ and a voltage drop of a diode $D_L$ being known, computing a current value ILI of a branch where the resistor $R_{L1}$ is located on the basis of the formula:

$I_{L1}=U_{L1}/R_{L1},$ and computing a voltage value between the ground line and the neutral line on the basis of the formula:

$U_{EN}=U_{L1}*(R_{L1}+R_{L2})\div R_{L1}+U_D,$ wherein $U_{EN}$ is a peak voltage of the ground line relative to the neutral line, and $U_D$ is the voltage drop of the diode $D_L$.

10. The grounding impedance measuring method according to claim 9, wherein the process of computing grounding impedance values of the live wire and the neutral line on the basis of the detected power supply voltage value, the current value in the positive alternating current half-cycle detection branch and the current value in the negative alternating current half-cycle detection branch specifically comprises:
    in the negative alternating current half-cycle, $I_N=I_{N0}+I_{N1}$, wherein $I_N$ is a total current in a measuring loop, $I_N=(U_{NL}-U_{EL})/R_N$, $I_{N0}$ is a current value between the live wire and the ground line, $I_{N0}=(U_{EL}/R_L$, $R_N$ is the grounding impedance value of the neutral line, and $R_L$ is the grounding impedance value of the live wire;
    in the positive alternating current half-cycle, $I_L=I_{L0}+I_{L1}$, wherein $I_L$ is a total current in a measuring loop, $I_L=(U_{LN}-U_{EL})/R_L$, $I_{L0}$ is a current value between the neutral line and the ground line, and $I_{L0}=U_{EN}/R_N$; and substituting $U_{NL}$, $U_{LN}$, $U_{EN}$, $U_{EL}$, $I_N$ and $I_{N0}$ into formulas for a combined solution to obtain:

$R_L=[(U_{NL}-U_{EL})*(U_{LN}-U_{EN})-(U_{EN}*U_{EL})]\div[I_{N1}*U_{EN}+I_{L1}(U_{NL}-U_{EL})]$ $R_N=[(U_{NL}-U_{EL})*(U_{LN}-U_{EN})-(U_{EN}*U_{EL})]\div[I_{L1}*U_{EL}+I_{N1}(U_{LN}-U_{EN})].$ 11. A grounding impedance measuring method, using the grounding impedance measuring circuit according to claim 2, and comprising:
    detecting the power supply voltage value of the isolated alternating current power supply;
    detecting a current value in the positive alternating current half-cycle detection branch and a current value in the negative alternating current half-cycle detection branch separately; and
    computing grounding impedance values of the live wire and the neutral line on the basis of the detected power supply voltage value, the current value in the positive alternating current half-cycle detection branch and the current value in the negative alternating current half-cycle detection branch.

12. A grounding impedance measuring method, using the grounding impedance measuring circuit according to claim 3, and comprising:
    detecting the power supply voltage value of the isolated alternating current power supply;
    detecting a current value in the positive alternating current half-cycle detection branch and a current value in the negative alternating current half-cycle detection branch separately; and
    computing grounding impedance values of the live wire and the neutral line on the basis of the detected power supply voltage value, the current value in the positive alternating current half-cycle detection branch and the current value in the negative alternating current half-cycle detection branch.

13. A grounding impedance measuring method, using the grounding impedance measuring circuit according to claim 4, and comprising:
    detecting the power supply voltage value of the isolated alternating current power supply;
    detecting a current value in the positive alternating current half-cycle detection branch and a current value in the negative alternating current half-cycle detection branch separately; and
    computing grounding impedance values of the live wire and the neutral line on the basis of the detected power supply voltage value, the current value in the positive alternating current half-cycle detection branch and the current value in the negative alternating current half-cycle detection branch.

14. A grounding impedance measuring method, using the grounding impedance measuring circuit according to claim 5, and comprising:
- detecting the power supply voltage value of the isolated alternating current power supply;
- detecting a current value in the positive alternating current half-cycle detection branch and a current value in the negative alternating current half-cycle detection branch separately; and
- computing grounding impedance values of the live wire and the neutral line on the basis of the detected power supply voltage value, the current value in the positive alternating current half-cycle detection branch and the current value in the negative alternating current half-cycle detection branch.

* * * * *